United States Patent [19]

Dimon

[11] 4,339,829

[45] Jul. 13, 1982

[54] AUTOMATIC TUNING SYSTEM FOR A NARROW BANDWIDTH COMMUNICATION

[76] Inventor: Donald F. Dimon, 2300 E. Oakland Park Blvd., Ste. 314, Fort Lauderdale, Fla. 33306

[21] Appl. No.: 974,312

[22] Filed: Dec. 29, 1978

[51] Int. Cl.$^3$ .............................................. H03J 7/02
[52] U.S. Cl. .................................... 455/340; 455/251; 455/234; 455/180
[58] Field of Search ............... 325/490, 489, 488, 484, 325/397, 399, 400, 404, 405, 408, 410–415, 457, 62.26, 63, 64, 67; 333/17 R, 17 L; 455/340, 339, 338, 334, 251, 242, 234, 233, 232, 192, 182, 188, 172, 180, 69, 68, 67, 62, 31

[56] References Cited

U.S. PATENT DOCUMENTS

| | | | |
|---|---|---|---|
| 2,976,408 | 3/1961 | Colaguori | 325/344 |
| 3,196,350 | 7/1965 | Dimon | 325/26 |
| 3,541,451 | 11/1970 | Lind | 325/344 |

*Primary Examiner*—Tommy P. Chin
*Attorney, Agent, or Firm*—Charles H. Lindrooth; Albert L. Free

[57] ABSTRACT

An adjustable tuning apparatus with automatic control of center frequency, damping or bandwidth, and signal level. Three simultaneous servo loops control center frequency, damping and level, separately and independently of one another. Center frequency tuning is accomplished by servo adjustment of the frequency axis of the adjustable tuning apparatus and by sensing amplitude or phase variations of signals being processed through said tuning apparatus, to obtain an error signal for said frequency axis servo. Damping or bandwidth control is accomplished by servo adjustment of damping in the adjustable tuning apparatus and by sensing amplitude or phase variations of signals being processed through said tuning apparatus to obtain an error signal for said damping axis servo. Level control is achieved by servo adjustment of the amplitude and polarity of signal applied at an input of said tuning apparatus and by sensing the level of recovered signal at an output of said tuning apparatus to obtain an error signal for said level control servo.

Said three axes of servo control of an adjustable tuning apparatus provide optimum tuning, damping or bandwidth, and level control, such that very weak signals may be selectively amplified and detected to the exclusion of undesirable signals and noise; and that such very weak signals may be thereby employed to automatically control the adjustable tuning apparatus.

26 Claims, 7 Drawing Figures

AUTOMATIC TUNING SYSTEM FOR A NARROW BANDWIDTH COMMUNICATION

RELATED U.S. PATENT DATA

This application refers to:
Armstrong, U.S. Pat. No. 1,113,149, Oct. 6, 1914;
DeForest, U.S. Pat. No. 1,507,016, and 1,507,017, Sept. 2, 1924,
Dimon, U.S. Pat. No. 3,196,350, July 20, 1965

BACKGROUND OF THE INVENTION

This invention relates to adjustable tuning apparatus preferably located at the input or antenna stages of a radio or similar signal processing apparatus. Prior art adjustable filters require that center frequency and bandwidth be predetermined by parameter settings, manually, mechanically, or electrically adjusted, or that input and output signals be sampled and processed to thereby determine tuning with respect to an applied reference signal. However, whenever it is desirable to automatically tune and track very weak applied signals, for example antenna signals at a radio receiver, it is not practical to sample the input signal.

Further, whenever regenerative processes are employed, such that weak signals are amplified and reinforced and reapplied to the tuning apparatus as in a regenerative receiver (Armstrong, DeForest), or in a high Q narrow bandwidth system (Dimon), stability and tuning with respect to an incoming signal is extremely difficult to achieve, even with a trained operator continually making tuning and circuit adjustments. This invention provides independent center frequency, bandwidth and signal level adjustments in accordance with signals being processed therethrough, including such signals as may be too weak to be ordinarily available for sampling. This invention applies to antenna tuning systems, receiver front end filters, Yttrium Iron Garnet (YIG) resonators, saturable core reactors, varicap diodes, tuned amplifiers, regenerative amplifiers and detectors, tuned bridge systems, such as the Wien, Meacham, resonant and twin tee bridges, wherein the center frequency is to be automatically controlled in accordance with an applied signal, the bandwidth is to be predetermined, and signal level controlled.

THEORY USED IN THE INVENTION

In a tuning system, such as a radio receiver, numerous arrangements are known in the art in which tuning is accomplished by means of a reference carrier signal. More particularly, digital synthesizers are well known which generate a reference carrier mathematically related for superheterodyne reception of an incoming carrier having modulations to be recovered. In all such prior art tuning systems, generation of the reference carrier does not provide preselection or tuning of the antenna system or other amplification stages located in the incoming signal path prior to the first mixer or conversion stage. Such prior art systems may be greatly improved by this invention. Antenna tuning and preselection are most necessary to recover signals from noise, to prevent spurious responses and to reject strong adjacent carriers.

Three factors may be used to mathematically describe a tuned circuit: Center frequency or tuned frequency; Q, which refers inversely to damping; and, the signal level. All three are important. Consider a simple series circuit containing a signal source, $E_g$, volts; capacitance of C farads; an inductance of L henries; and, R the total resistance in ohms which may be positive or negative (regenerative). The current in amperes, I, is seen to be:

$$I = E_g/(LD + R + 1/CD) \qquad \text{(Eq. 1)}$$

where D is the differential operator in time t seconds.
The denominator in Eq. 1 is seen to be of the form:

$$(D/w_a) + (1/Q) + (w_a/D) \qquad \text{(Eq. 2)}$$

where $w_a$ is the resonant frequency of the tuned circuit in radians per second. Where R is a negative resistance, Q will be negative and oscillations will build up.

Where $E_g$ is an applied signal carrier of w radians per second, the denominator is seen to be:

$$1/Q + j(w/w_a - w_a/w), \qquad \text{(Eq. 3)}$$

where j represents the square root of minus one.

The real portion of the denominator vanishes where Q is infinite. This corresponds to zero damping and zero bandwidth. The imaginary portion of the denominator will vanish where w and $w_a$ are of the same value. This corresponds to the exact tuning with respect to an applied signal carrier.

Whenever Q is a large number, amplification will be large at $w = w_a$, and an incremental change in damping will be phase sensitive to the polarity of Q. Whenever Q is a positive number, a decrease in damping will increase the gain; and, whenever Q is negative, a decrease in damping will reduce the gain. The gain to an applied carrier is seen to reverse phase by 180° as Q passes through infinity. This property may be employed in the invention to sense for bandwidth and thereby drive a servo system for automatic control of damping in the adjustable tuning apparatus.

In the series tuned circuit, whenever w is larger than $w_a$, phase lag occurs; and, when w is smaller than $w_a$, phase lead occurs. For either positive or negative values of Q, amplification reaches a peak at $w = w_a$ and becomes less as w and $w_a$ are proportionately unlike in value. In a parallel resonant circuit, phase lead occurs for values of w larger than $w_a$; and, when w is smaller than $w_a$ phase lag occurs. In this invention, tuning for $w = w_a$ may be sensed by phase comparison of input and output carriers, or by application of known perturbation on the tuning variable $w_a$. Recovered AM will be phase sensitive to $w = w_a$, the point of maximum gain.

Whenever Q is a large number, amplification will be large. Whenever Q becomes negative, oscillations will build up at the center tuned frequency. Prior art systems generally reduce regeneration and increase damping to control signal level build up. In this invention, signal level control is achieved by a separate servo system which controls a signal being applied at the input of the adjustable tuning apparatus, applying said signal of opposing phase or polarity as would ordinarily cause build up to thereby regulate and control the signal level at the output, and to thus achieve level control without affecting the damping or tuning of the adjustable tuning apparatus.

SUMMARY OF THE INVENTION

In accordance with the present invention, an adjustable tuning apparatus, controlled by three separate servo loops, which sense for signal variations at the output of the tuning apparatus is thereby made to track and tune an applied input signal. The center frequency, bandwidth, and signal level are separately and simultaneously controlled in accordance with signals being processed therethrough. The invention may be used in all applications requiring frequency selective tuning and filtering of applied input signals, and has the further advantage of automatically correcting for drift, signal changes, and parameter variations which would ordinarily be expected to cause mistuning and instability.

One object of the invention is to provide automatic tuning of a frequency selective network to track an input signal.

One other object of the invention is to provide damping and bandwidth adjustment of a selective network and to correct for critical parameters and their changes in values automatically.

Another object of the invention is to provide automatic level control of a frequency selective network independently of the damping adjustment of said network.

Another object of the invention is to provide simultaneous automatic tuning and bandwidth control of a frequency selective network to track an applied signal with minimal attenuation.

Another object of the invention is to precisely regulate a regenerative receiver or regenerative amplification stage.

A further object of the invention is to regulate frequency selective bridges such as the Wien, Meacham, Twin Tee, or Resonance Bridge.

Still further objects of this invention include the stabilization of Yttrium-Iron-Garnet (YIG) resonators, saturable core adjustable tuning reactors, varicap diode radio tuners, quartz crystal or other such frequency selective devices.

Other objects and advantages of this invention are apparent from the foregoing, from the following description, and from the appended drawings of preferred embodiments.

DESCRIPTION OF A PREFERRED EMBODIMENT

Figure 1:
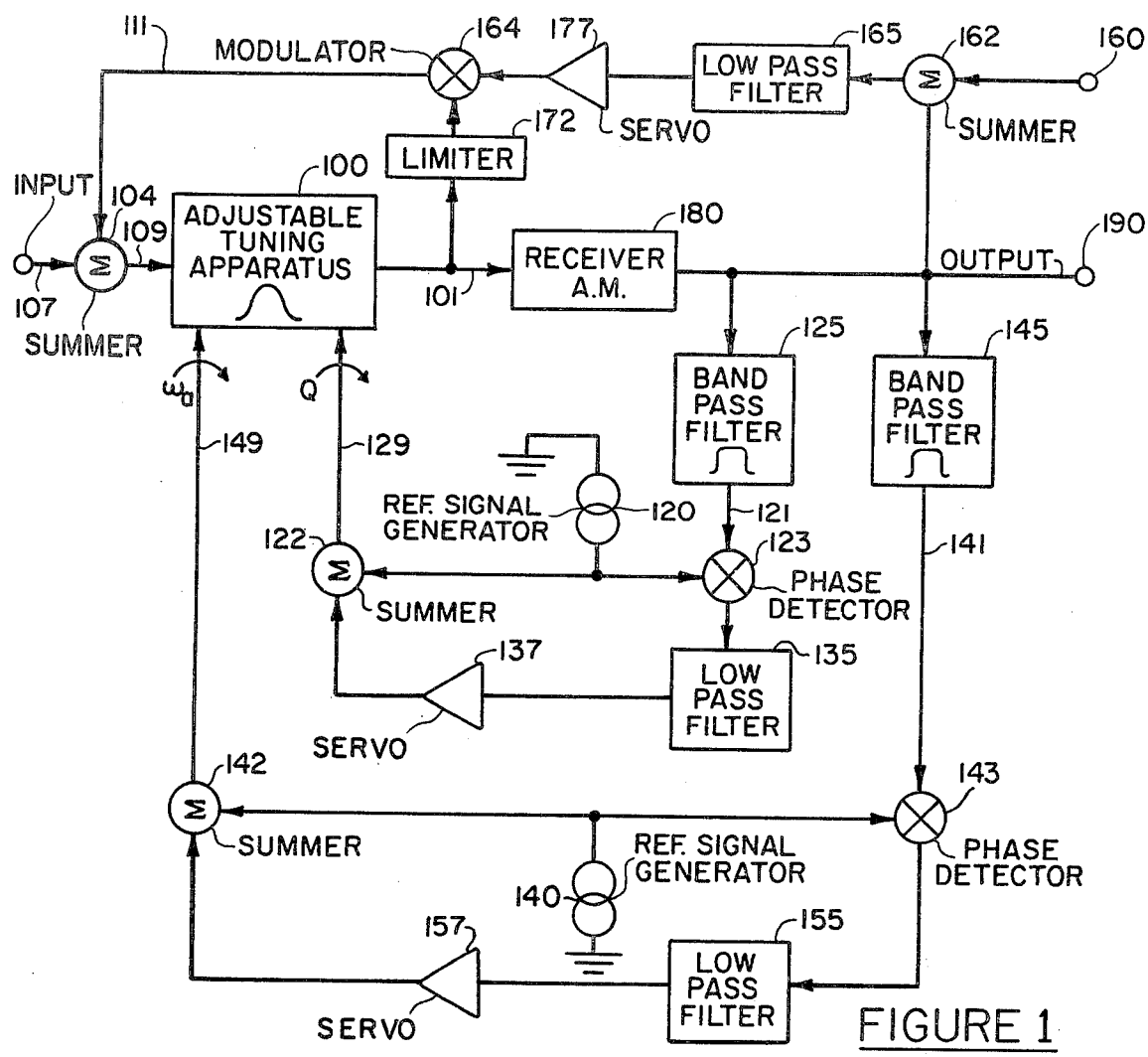
FIG. 1 is a block schematic diagram of an embodiment hereof, wherein an adjustable tuning apparatus is simultaneously controlled by three independent servo loops to provide automatic center frequency adjustment, bandwidth control and automatic level control.

The preferred embodiment shown in block diagram in FIG. 1, employs an adjustable tuning apparatus 100, which has adjustment means to control its center frequency 149, and its damping or bandwidth of a control signal 129. An input signal to be processed is applied at 107, where it is summed at 104 with a signal 111 used in level control, and applied at 109 to said tuning apparatus 100. An output is taken at 101 from the tuning apparatus 100 and processed through a receiver 180 to recover amplitude modulation. Three separate servo loops are employed for control purposes.

Center frequency is controlled by use of a low frequency (which may be subaudible) signal generator 140, whose signal is summed at 142 and introduced at 149 as a perturbation on the center frequency of the adjustable tuning apparatus 100. Said perturbation is summed with the output of servo system 157. At the output of the receiver 180, recovered AM 190 is bandpass filtered at 145 to coincide with the reference frequency employed at 140, to pass said frequency, and the recovered signal is phase compared with the reference signal at phase sensitive detector 143 provided to determine the phase of recovered AM at the reference frequency of generator 140 relative to the phase of said generated signals from 140. In accordance with the invention, phase of recovered AM will be a minimum at values of $w_a$, the center frequency of said apparatus 100, equal to the frequency w of an applied signal 109. An error signal is recovered at 143, filtered at 155, and applied to said servo 157 to be thence applied 149 to the adjustable apparatus 100. In this manner the frequency control servo provides tracking of an applied input signal.

Damping or bandwidth is controlled by use of another low frequency (which may also be subaudible) signal generator 120, whose signal is summed at 122 and introduced at 129 as a perturbation on the damping adjustment of the tuning apparatus 100. Said perturbation is summed with the output of servo system 137. Recovered A.M. modulations at the output of the receiver 180 are filtered at 125 to selectively pass signals of the perturbation frequency generator at 120, and phase compared with said reference generator 120 at phase sensitive detector 123, filtered at 155 and used to drive servo system 157. In accordance with the invention, phase of recovered AM at the reference signal generator 120 frequency will be a minimum for zero or minimum damping adjustment as provided by signal 129 in adjustable tuning apparatus 100. The error signal recovered from the phase detector 123 is filtered at 135 and applied to control servo 137 and thereby used to adjust the damping of said apparatus 100. In this manner, the damping of the system is stabilized and controlled, independent of signal variations or parameter changes.

Signal level is controlled by a third separate servo which obtains an output from the receiver 180, and compares the output level with a D.C. reference potential 160 at 162, filters the error signal at 165 and drives a servo amplifier 177 to set a modulator 164. Said modulator provides for positive or negative insertion of a signal from limiter 172 to be applied (111) to the input summing network 104. Said limiter strips modulation content from signal 101 produced by the adjustable tuning apparatus, to provide a reference carrier, void of amplitude variations at the frequency and phase being processed through said tuning apparatus 100. In the event that signal level at 190 exceeds reference level 160, modulator 164 permits carrier signals from 172 to be applied inversely to input 109 of the tuning apparatus to thereby drive the system down to a signal level below reference signal level preset at 160. In this manner, in accordance with the invention signal level is independently controlled.

It is seen that each servo will be independent. Further, as each servo finds minimal errors, the entire system will perform more efficiently, since each servo will not have large signals from any other servo. Also, where tracking is very close, the adjustable tuning apparatus will provide minimal AM due to the induced perturbations, affording optimum isolation among the three independent servo systems. The amplitude of the perturbations may be preset by signal levels employed at 120 and 140 to provide the desired amount of selectivity and bandwidth of the embodiment of FIG. 1.

DESCRIPTION OF ANOTHER PREFERRED EMBODIMENT

Figure 2:
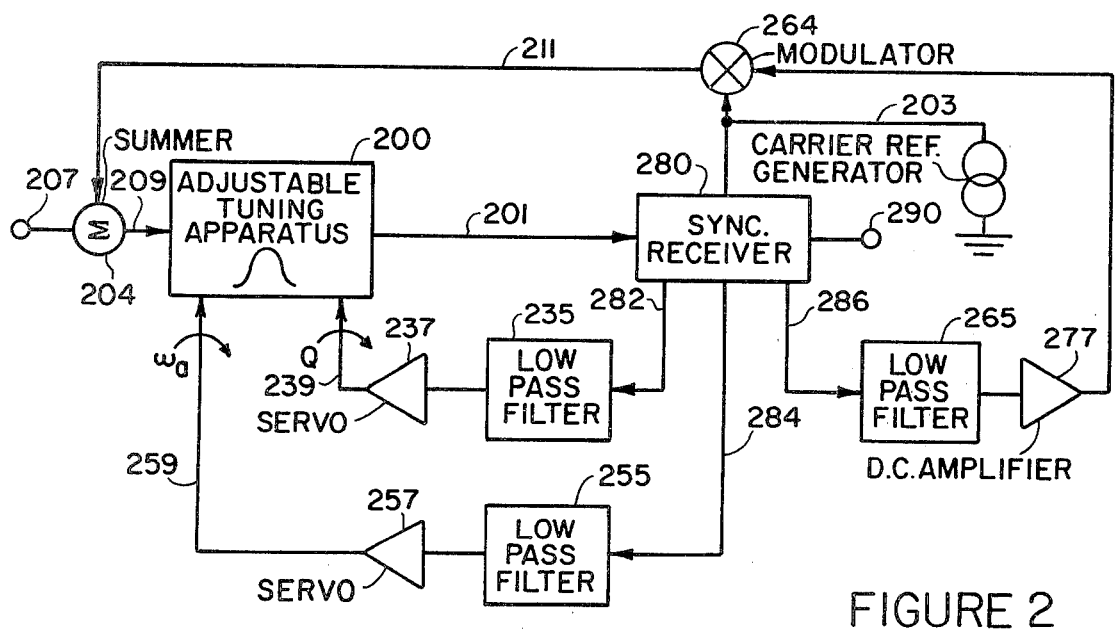
FIG. 2 is another block schematic diagram of an embodiment hereof, wherein an adjustable tuning apparatus is simultaneously servo controlled for center frequency, bandwidth and level.

Reference is made to FIG. 2 where a block diagram is shown of another preferred embodiment of the invenion. In FIG. 2, an adjustable tuning apparatus 200 has adjustment means to control its center frequency 259, and its damping 239, An input signal to be processed is applied at 207, where it is summed at 204 with a signal 211 used in level control, and applied at 209 to said tuning apparatus 200. An output is taken at 201 and processed in a synchronous receiver to produce phase information of signals processed in the tuning apparatus 200, and amplitude information of said signals. Three separate servos loops are employed for control purposes.

Center frequency is controlled by phase detecting for signals at 201 in comparison with a reference signal 203, which is also applied through a level control modulator 264 and applied to the input 209 through summing network 204. Phase errors are filtered at 255 and amplified at 257 to servo control the center frequency at 259. In accordance with the invention, a minimal phase error exists when tuning of $w_a = w$, the frequency of incoming signal.

Damping or bandwidth is controlled by use of another servo, by sensing for quadrature detection phase changes which become minimal at zero or minimal damping. In accordance with the invention, the recovered quadrature signal will change phase 180° at values of zero damping or infinite Q. The quadrature error signal 282 is filtered at 235 and amplified at 237 to control damping at 239.

Signal level is controlled by a third separate servo which obtains an error signal 286, said error signal representing an error in output amplitude relative to a predetermined value from the receiver 280, which is filtered at 265 and amplified at 277, to control a modulator 264 which permits amplitude and polarity control of reference signal 203 to be summed through summing device 204 to the input 209 of the adjustable tuning apparatus 200. The signal at 211 is of opposing polarity to reduce recovered signal levels in the event recovered levels exceed said predetermined values in 280.

DESCRIPTION OF YET ANOTHER PREFERRED EMBODIMENT

Figure 3:
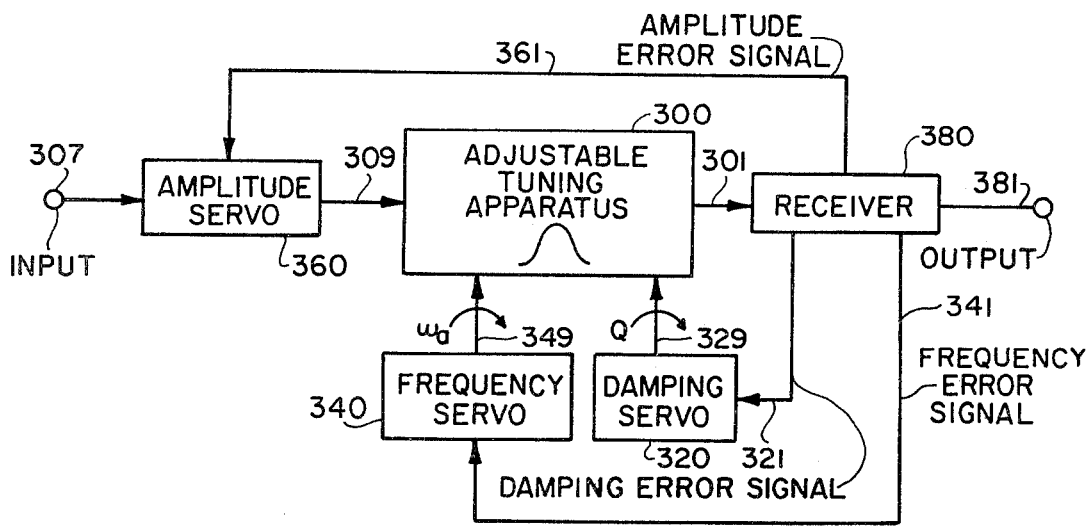
FIG. 3 is a generalized block diagram of the invention.

Reference is made to FIG. 3 where a block diagram is shown of another preferred embodiment of the invention. In FIG. 3, an adjustable tuning apparatus 300 had adjustment means to control its center frequency at 329, and its damping at 340. A signal is applied to an input of said tuning apparatus at 309, processed therethrough and recovered at 301 where it is processed through detection means 380, having an output 361 which is replical of the carrier appearing at 301, but devoid of amplitude variations, containing only phase coherence to the carrier at 301, an output 341 containing in error signal describing frequency detuning of said apparatus 300 in relation to an applied signal at 309, and an output 321 containing an error signal describing damping of signals processed through said tuning apparatus 300.

A servo system 340 is used to adjust center tuned frequency at 349 to minimise errors applied to said servo at 341, thereby tuning said adjustable tuning apparatus 300 in accordance with signals processed therethrough, for minimum attenuation.

Another servo system 320 is used to adjust damping at 329 to minimise errors applied to said servo at 321, thereby adjusting said tuning apparatus 300 for optimum selectivity to tuned signals being processed therethrough.

Another servo system 360 is used to apply amplitude demodulated carrier signals at input 309 to said adjustable apparatus 300 in order to reduce signal level recovered at 301 to a predetermined value. An input 307 is used to apply external signals to the system.

It is clear that three parameters are controlled simultaneous and independently, such that center tuned frequency, damping or bandwidth, and signal level of the adjustable tuning apparatus 300, and that signals processed therethrough are tuned and tracked. An output may be recovered at 381. Said output 381 will contain highly selected and amplified signal detection of tracked signals applied at 307.

Figure 4:
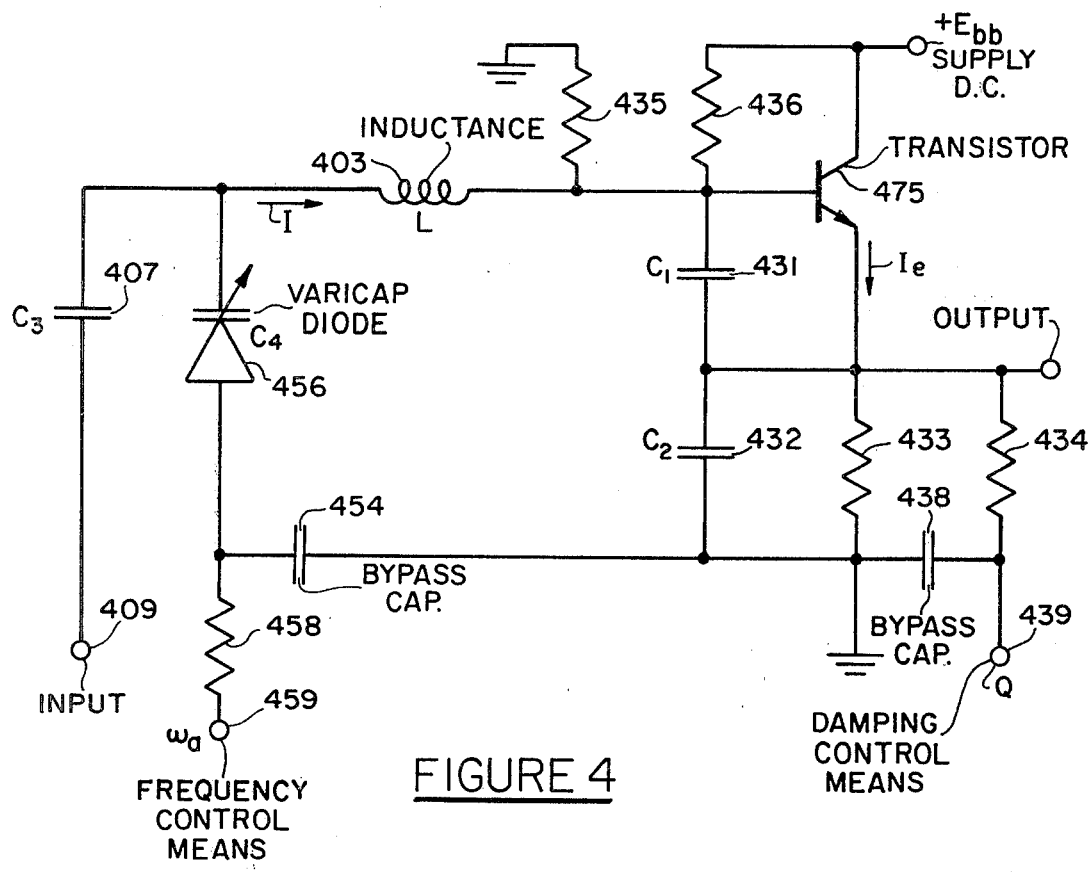
FIG. 4 is a schematic diagram of an adjustable tuning apparatus which may be employed with the invention, and incorporated as part of the block diagrams of either FIG. 1 or 2, or 3.

FIG. 4 is a schematic diagram of a time variant system which may be employed as an adjustable tuning apparatus for use with this invention and in accordance with the invention. In FIG. 4, a tuned circuit comprising an inductance L (403), and a capacitance $C_3$ (407) parallel with a varicap diode $C_4$ (456) also includes an active device, transistor 475 having a capacitor $C_1$ (431) between emitter and base, and another capacitor $C_2$ (432) between emitter and ground. The transistor is arranged similarly to an emitter follower, except for the capacitors $C_1$ and $C_2$. The D.C. current flowing in the emitter of the transistor may be controlled by the potential applied at 439, since the emitter potential is fixed by the resistive divider 436 and 435 setting the potential at the base of 457. $C_1$ and $C_2$ are many times larger than the total value of $C_3$ and $C_4$ in parallel and thereby have little effect on tuned frequency, which is adjustable in accordance with a potential applied at 459 through resistor 458 to the varicap 456. A bypass capacitor 454 is used to electrically ground the varicap to high frequency signals. The potential difference (D.C.) across the variacap and its value of capacitance is controlled by the relative value of potential applied at 459 and by the resistive divider 436 and 435 and supply potential $E_{bb}$. Where C is the total circuital capacitance of $C_3$ and $C_4$ in parallel and in series with $C_1$ and $C_2$, the center frequency will be $1/\sqrt{LC}$ in radians per second.

Damping is controlled by emitter current control by applied potential at 439. The series current in the loop, I flows through $C_1$; the base to emitter alternating signal is found to be $I/jwC_1$. A negative resistance is created since a potential of $(I/jwC_1)(gm/jwC_2)$ is generated in series with the tuned circuit. The negative resistance has a value in ohms of $gm/(wC_1wC_2)$, where gm of the transistor is nearly proportional to emitter current. Oscillation will occur where the negative resistance exceeds the circuital losses in the coil and other portions of the tuned circuit. This particular tuning apparatus was found to be extremely stable, with very large values of Q, where $C_1$ and $C_2$ were made as large as possible such that oscillation was still possible for all variations of $C_4$ and emitter current as controlled at 459 and 439 respectively. An input may be introduced at 409.

In a variation of the apparatus in FIG. 4, $C_4$ was fixed and L was a saturable reactor. Tuning was accomplished by adjusting the current in the control winding of the reactor L connected at 403. The control winding was connected at 459 and ground and 458 and 454 were eliminated with $C_4$ a fixed capacitor and grounded at its normal connection at 454 and 458.

In another variation of the apparatus in FIG. 4, both a varicap diode and a saturable reactor were employed for tuning in order to achieve a greater range of tuned frequency, than with just either one alone. The apparatus shown in FIG. 4 is exemplary of course and not limiting on the broad invention.

DESCRIPTION OF A BRIDGE TYPE ADJUSTABLE TUNING APPARATUS FOR USE WITH THE INVENTION ACCORDING TO THE INVENTION

Figure 5:
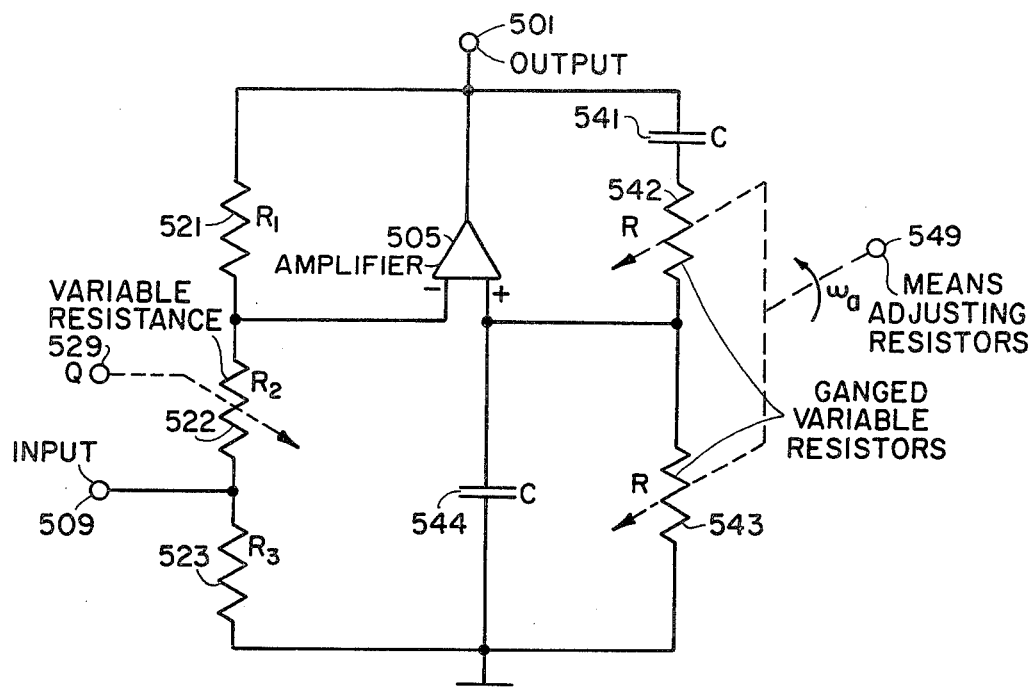
FIG. 5 is a schematic diagram of another adjustable tuning apparatus which may be employed with the invention, according to the invention and incorporated as part of the block diagrams of either FIG. 1 or 2, or 3.

In FIG. 5, a Wien Bridge type of tuning apparatus is shown schematically in accordance with this invention. In FIG. 5, a Wien Bridge comprises a series R and C 541 and 542 respectively and identical resistance and capacitor R and C at 543 and 544, but in parallel comprising two arms of the bridge. The other two arms are made of resistors 521, $R_1$ and $R_2$ being 522 and 523 in series. A differential amplifier 505 drives the bridge at 501, which also provides an output. An input is provided at 509. Center frequency will be $1/RC$ in radians per second, where R is in ohms and C in farads. Resistors 542 and 543 are controlled in value by a servo control signal at 549, thus providing control of center tuned frequency. A separate servo input 509 is used to control the value of 522 to adjust bandwidth. Bandwidth will be broadened as 522 is increased in value. Reducing 522 will cause zero bandwidth to be reached where $R_2$ (522 and 523 in series) is one half the value of 521. I have found that this tuning apparatus in FIG. 5 worked particularly well in the invention when long wave signals were being tuned and tracked, such as those between 10,000 and 100,000 cycles per second. The tuning apparatus in FIG. 5, of course, is exemplary and not limiting on the broad invention.

Figure 6:
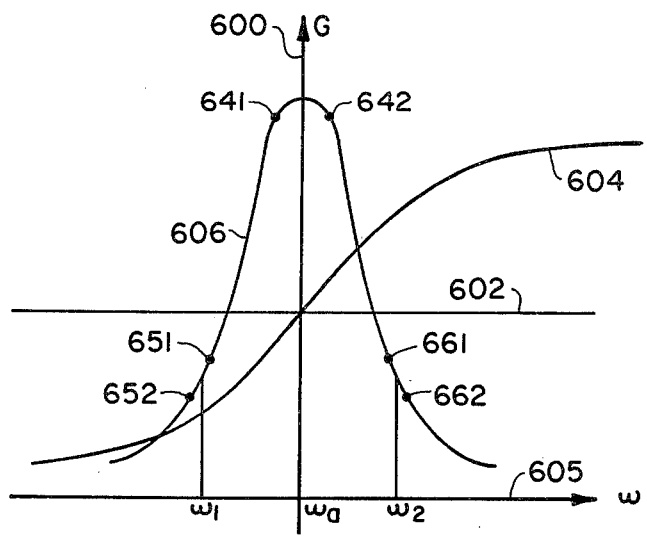
FIG. 6 is gain and phase shift plotted versus frequency, typical for an adjustable tuning apparatus as found described schematically in FIG. 4 or 5.

FIG. 6 contains a gain and phase diagram, useful in the teaching of the invention. In FIG. 6, a vertical axis 600 represents units of gain and phase shift, while an horizontal axis 605, represents units of frequency. The gain curve 606 will peak at values of $w=w_a$, and become less at either side of the vertical axis 600 where $w=w_a$. Phase shift will have a minimal value where gain reaches a peak and rapidly change on either side, as shown in 604. In some embodiments hereof, a fixed phase shift is encountered which adds or subtracts to the curve 604, shifting the entire curve upwards or downwards. Depending upon the type of tuning employed, phase shift will be lagging or leading, and the amount of phase shift will of course depend on the type and number of stages employed, all of which is well known in the electrical arts and in tuned circuit theory.

In FIG. 6, it is seen that if $w_a$ has an applied perturbation causing gain to fall to 641 and 642 alternatively, a double frequency signal will result in the frequency axis control signal and error at the perturbation frequency will be minimal. However, if the apparatus is detuned to $w_1$ and perturbations cause the gain to vary between 651 and 652, amplitude modulations in the perturbation frequency will occur of a particular phasing; and, if the apparatus is detuned to $w_2$, on the opposite side of optimum tuning, amplitude modulations in the perturbation frequency will occur 180° out of phase with those as found on the other side of optimum tuning. In this way the servo system is driven to optimum tuning.

I have found that when the invention is used for obtaining very narrow bandwidths, that is, when the Q is very large, that the servo systems must be designed to take into account a very long time constant introduced by the adjustable tuning apparatus. The tuning apparatus will exhibit the properties of an integrator, for each tuned circuit therein employed, where damping is minimal. The value of this time constant was found to be identical to that as would be produced by a simple RC network having a 6 db per octave roll off at a frequency $w_a/2Q$. For example, at 1 megacycle, and $Q=100,000$ $w_a/2Q$ was 50 cycles per second. This factor must be included in designing the servo systems for maximum gain and stability; all of which is well known in the electrical arts and servo system design.

Figure 7:
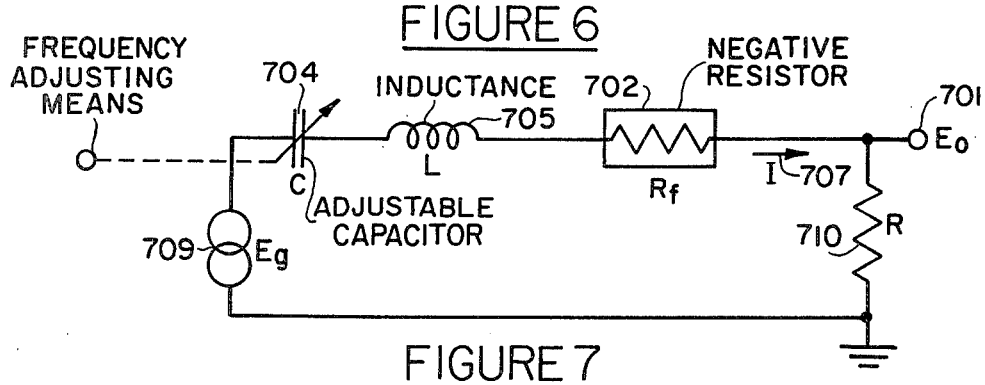
FIG. 7 illustrates schematically a series resonant circuit, equipped with a negative resistance, useful in teaching the invention and suitable for use with the invention and according to the invention as an adjustable tuning apparatus.

FIG. 7 illustrates a simplified schematic diagram of a series resonant circuit, useful in teaching the invention. Of course the invention is not limited to series resonant circuits, and the apparatus in FIG. 7 is exemplary only. In FIG. 7, a signal source 709, $E_g$ volts, a capacitor 704, C farads, and inductance 705 L henries, a negative resistance 702 $R_f$ ohms and a positive resistance 710, R ohms are all in series; and, a current I amperes 707 flows due to the signal source 709. The potential $E_o$ taken across R is seen to be, from Kirchoff's laws:

$$E_o = \frac{R}{LD + R - R_f + 1/CD} E_g \quad \text{(Eq. 4)}$$

If we let $E_g$ represent a sinusoidal of, $$E_g = Ae^{jwt}, \quad \text{(Eq. 5)}$$

where A is a constant in volts, e is the base of naperian logarithms and t is the time in seconds, with w as the angular frequency in radians per second.

Passing through the indicated operations, since D is the differential operator, we have:

$$E_o = Ae^{jwt} \frac{R}{jwL + R - R_f - j/wC} \quad \text{(Eq. 6)}$$

The denominator will vanish in equation 6 only if, $$R = R_f \quad \text{(Eq. 7)}$$

and, $$wL = 1/wC \quad \text{(Eq. 8)}$$

or, $$w = 1/\sqrt{LC} \qquad (Eq. 9)$$

In this invention, both these conditions are met, by simultaneous servo systems, hence the gain is extremely large.

The term, Time Variant Filter applies to tuning systems, in which one or more elements may vary with time. All such items, are included within the adjustable tuning apparatus in accordance with the invention, and the term is used interchangeably.

Whenever low frequency signal generators are employed in the frequency control axis or in the damping axis in this invention, said reference generators are not bound to any specific frequency or waveform. Sine wave or other periodic waveforms may be employed, or nonperiodic signals may be employed, even noise. However, the choice must include bandwidth consideration for the bandwidth limitation of the overall signal processing system, including the adjustable tuning apparatus and the signal detection means. Phase sensitive servos as employed herein may also have large amounts of extraneous noise added thereto with little degradation in performance. As well known in servo systems and the electrical arts, improvements in servo operation are found by increasing gain in the loop and shaping the servo loop transfer function to optimise gain without oscillation or blocking. Accordingly, I have found that very weak signals could be tracked and tuned by limiting each servo to a single sinusoidal reference signal at a a low frequency and by insertion of narrow bandwidth filters and limiters after the signal detection means and just prior to the input to the servo amplifier in each instance. These variations were found to permit higher loop gains in the employed servo loops and thereby greater tracking accuracy was achieved. In some applications, it was necessary to include phase shift networks in each servo loop to optimise the servo response to compensate for other phase shifts in the system to the servo control signals, including phase shifts in the adjustable tuning apparatus. It was also found that as bandwidth was very narrow in the tuning apparatus, phase lag occured in the respective servo loops for center frequency and damping, and lead networks were required for optimum performance in the servo loops.

The invention may of course employ less than three servo loops. Any single servo may be used alone, or any pair may be employed. Where bandwidth is not important, the invention may employ just a frequency control servo and thereby track an applied signal accurately and automatically, and tuning is achieved with very few components. It was found that with the invention where all three servos were employed, automatic tuning and tracking was obtained near 1 megacycle with a value of Q exceeding 100,000.

In one embodiment of the invention, two simultaneous servos were employed with excellent results. One servo was used to track the frequency of an applied signal; and, another servo was used to control regeneration. The regeneration control servo used the level sensing as found in elements 160, 162, and 165 of FIG. 1 and damping control elements 237 and 239 of FIG. 2. Regeneration was controlled thereby by sensing for signal level buildup, and gain was reduced by applying a correcting signal to the parameter controlling regeneration in the adjustable tuning apparatus.

In another embodiment, the frequency servo was both manually and automatically tuned in accordance with the invention. The manual tuning was used to provide approximate tuning, while the automatic tuning was used for fine tuning of a small portion of the spectrum. In this embodiment the losses associated with a variable tuning parameter, such as a varicap diode were minimised due to the fact that a large capacitor of very low losses was in parallel with the variable element, the varicap. This arrangement provided for very stable operation with less gain in the servo systems.

In a radar embodiment, a YIG resonator was used for front end tuning. The control current for the YIG was divided into two portions; one portion for automatic tuning in accordance with the invention; and, a larger portion used to set the approximate center frequency. The larger current, setting the appproximate frequency was supplied and regulated by a small computer incorporated within the radar system. The computer also supplied information for the local oscillator, which also used YIG elements. The automatic tuning, in accordance with this invention provided accurate fine tuning for the front end YIG.

In one embodiment only one servo amplifier was employed, but a switching system permitted the sole servo amplifier to be time shared for use in each servo axis. Capacitors were used to hold the value of control signal achieved by each servo loop during the time that the servo amplifier was switched to another servo loop. Such time sharing techniques are well known in the arts, and useful with the invention to save on component costs.

Whenever, less than three servo systems are used, the system performance is less accurate. For example, I have found that embodiments which have only a frequency tuning servo system have a wide variation in damping as the tuning apparatus is tuned over a wide band of frequencies. This is due to the practical availability of tuning elements, all of which have energy losses and thereby introduce damping into the system. As adjustment is required, even greater amounts of damping is introduced than usually found in fixed tuned elements. Thus a wide variation in damping occurs across the tunable range. When regeneration is employed to offset the losses, the portion of the spectrum having lower losses will have a very narrow bandwidth, compared to the rest of the range. Thus a second servo is most desirable to maintain low losses and to control bandwidth over the range. The use of the second servo, and regeneration, then invites the use of the third servo to control signal level and thereby complete the system and optimise its overall performance.

The invention has application, with only a frequency control servo in low cost applications, such as inexpensive broadcast receivers. The invention is used to tune the antenna stage, and only a single oscillator is required, which may be manually tuned, without the need of a ganged tracked antenna tuning stage. When very high performance is required, two or more servos are employed. The invention has application in receiver which employ a frequency synthesisor for oscillator injection signal. No tracking or manual devices are required, and performance is excellent. The invention is employed to track and tune the front end of the receiver.

The invention achieves an extremely high performance when employed with a synchronous, direct conversion receiver. The direct conversion process removes the need for intermediate frequency (I.F.) stages, removes spurious responses related to the I.F. frequency, and the exactly tuned front end, according to the invention tunes the antenna stage, removing all other spurious responses. The local oscillator is also phase locked to the incoming signal. The use of the regenerative front end, with control, appears to have performance greater than found with ordinary superhetrodyne systems due to removal of losses in the antenna system by feedback, exactly controlled, all in accord with this invention.

I have found that to obtain the best operation with the invention, that the modulation bandwidth of signals to be applied must be considered in relation to the bandwidth of the tuning system. Where the applied input signal incorporates frequency modulation, the tuning apparatus will be of two types. The first type is where the bandwidth of the tuning system is wide enough to permit all important sidebands of the frequency modulated carrier to pass. The second type, is where the tuning system has a very narrow bandwidth, and sideband passage is limited. In this second case, the frequency control servo system must be rapid enough to follow the frequency modulation excursions of the applied carrier. In one embodiment, it was found helpful, in the servo design, to introduce the modulation recovered by the detection means representing frequency excursions of the applied carrier signal to the frequency control servo system, to ease the servo requirements and to insure better tracking.

The use of phase detection servos is particularly well recommended, although the invention is not limited to using phase detection servo means, in that phase detection of several signals may be easily separated by the detection process alone, since the phase detector produces no output from the signals of a frequency different from an applied reference signal. In this, several reference signals may be separated by the rejection properties of the phase detectors respectfully rejecting all signals different from their respective reference signals. Of coursse, the use of selective filters improves isolation, and reduces the problems of servo overload due to extraneous signal application, all of which is well known in the electrical servo arts.

Simultaneous control of signal level has another stabilizing influence on the system. Practical elements comprising a tuning system will have nonlinearities, such that parameters change for differing signal levels. In this invention, signal levels are predetermined and regulated, thereby automatically correcting for parameter changes due to said nonlinearities.

I have found that by using a high gain servo for level control, that incoming modulation of the amplitude of the carrier may be removed, and that the level control servo may be used as a feedback amplitude demodulator.

It is clear to any one skilled in the electrical arts, that numerous changes and variations may be made in the described embodiments without departing from the spirit and scope of the invention. It is thus to be known, that the structures described and shown in the attached drawings are merely exemplary and not limiting on the broad invention.

What is claimed is:

1. Automatic control apparatus for control of center frequency of an adjustable time variant filter, having center frequency control means, including:
   means applying an input signal to be processed in said filter,
   means generating a reference signal,
   means applying the reference signal to the center frequency control means of the filter, inducing amplitude modulations of the signal at the filter output,
   modulation detection means recovering and reproducing the reference induced amplitude modulation signal at the filter output,
   phase detection means producing a control signal in accordance with the phase difference between the reference signal and the recovered and reproduced reference induced modulation,
   means applying the control signal to the center frequency control means of the filter.

2. A signal processing system according to claim 1, where the time variant filter includes a Yttrium-Iron-Garnet (YIG) resonator and associated control apparatus.

3. A signal processing system according to claim 1 where the time variant filter includes a saturable core inductor for center frequency control.

4. The apparatus of claim 1 where the filter includes a varicap diode network for center frequency control.

5. The apparatus of claim 1 where the filter includes a wien bridge network with adjustable elements for control of center frequency.

6. The apparatus of claim 1 where the filter includes a resistance capacitance active filter network with adjustable elements for center frequency control.

7. The apparatus of claim 1 where the filter includes an adjustable active filter.

8. The apparatus of claim 1 where the modulation detection means is a radio receiver.

9. The apparatus of claim 1 where the control signal is further coupled to means providing a predetermined center frequency setting of the filter.

10. The apparatus of claim 1 where the filter is in the front end of a radio receiver.

11. The apparatus of claim 1 where the filter is a regenerative active network.

12. Automatic control apparatus for simultaneous control of center frequency and bandwidth of an adjustable, time variant filter, having separate center frequency control means and bandwidth control means, including:
   means applying an input signal to be processed in said filter,
   means generating a first reference signal,
   means amplitude modulating the applied input signal with the first reference signal,
   means applying the first reference amplitude modulated signal to the adjustable, time variant filter,
   means generating a second reference signal,
   means applying the second reference signal to the center frequency control means of the filter, inducing second reference signal modulation of the signal at the output of the filter,
   said means applying the first reference amplitude modulated signal comprising first modulation detection means recovering and reproducing the first reference induced amplitude modulation signal at the filter output, first phase detection means producing a first control signal in accordance with the phase difference between the first reference signal and the first reference induced modulation, means applying the first control signal to the bandwidth control means of the filter, second modulation detection means recovering and reproducing the second reference signal induced amplitude modulation signal at the filter output, second phase detection means producing a second control signal in accordance with the phase difference between the second reference signal and the recovered second reference signal induced amplitude modulation signal, means applying the second control signal to the center frequency control means of the filter.

13. The apparatus of claim 12 where the filter includes a Yttrium-Iron-Garnet (YIG) resonator and associated control apparatus for center frequency control.

14. The apparatus of claim 12 where the filter includes a saturable core inductor for center frequency control.

15. The apparatus of claim 12 where the filter includes a varicap diode network for center frequency control.

16. The apparatus of claim 12 where the filter includes a wien bridge network with adjustable elements for control of center frequency and for control of bandwidth.

17. The apparatus of claim 12 where the filter includes a resistance capacitance active filter network with adjustable elements for control of center frequency and for control of bandwidth.

18. The apparatus of claim 12 where the filter includes an adjustable active filter.

19. The apparatus of claim 12 where the modulation detection means is a radio receiver.

20. The apparatus of claim 12 where the first and the second modulation detection means include a single modulation detection means together with selective filters for respective separation and reproduction of said first and second reference signal induced amplitude modulated signal.

21. The apparatus of claim 12 where the first phase detection means includes provision for addition of an offset phase to adjust filter bandwidth.

22. The apparatus of claim 12 where the second control signal is further coupled to means providing a predetermined center frequency setting of the filter.

23. The apparatus of claim 12 where the filter is in the front end of a radio receiver.

24. The apparatus of claim 12 where the filter is a regenerative active network.

25. Automatic control apparatus for simultaneous control of center frequency, bandwidth and signal level of an adjustable tuning apparatus, having separate center frequency control means, bandwidth control means and signal level control means, including:

means applying an input signal to be processed in said filter, means generating a first reference signal, means applying the first reference signal to the center frequency control means of said tuning apparatus, inducing amplitude modulation of the signal at the tuning apparatus output, amplitude modulation detection means recovering and reproducing the first reference signal induced modulation at the tuning apparatus output, phase detection means producing a first control signal in accordance with the phase difference between the first reference signal and the recovered and reproduced first reference signal induced modulation, means applying the first control signal to the center frequency control means of the tuning apparatus, means generating a second reference signal, means applying the second reference signal to the bandwidth control means of the tuning apparatus, inducing second amplitude modulation of the signal at the tuning apparatus output, amplitude modulation detection means recovering and reproducing the second reference signal induced modulation at the tuning apparatus output, phase detection means producing a second control signal in accordance with the phase difference between the second reference signal and the second reference signal induced modulation means applying the second control signal to the bandwidths controls means of the tuning apparatus, means removing amplitude modulation from the signal at the output of the tuning apparatus, means detecting signal level at the output of the tuning apparatus, means comparing said detected signal level with a predetermined level to produce a third control signal, means modulating said output signal at the tuning apparatus in accordance with amplitude and phase of said third control signal, producing a level control signal, means applying said level control signal to the input of the tuning apparatus to automatically correct signal level.

26. Automatic control apparatus for simultaneous control of center frequency, bandwidth, and signal level of an adjustable tuning apparatus, having separate center frequency control means, bandwidth control means, and signal level control means, including:

means applying an input signal to be processed in said filter, receiver means producing error a frequency signal in accordance with the center tuned frequency of said tuning apparatus and the frequency of said applied input signal, servo means driving the center frequency control means of said adjustable tuning apparatus in accordance with said error frequency signal to tune said tuning apparatus in accordance with the frequency of said applied input signal, said receiver means also producing bandwidth error signal in accordance with the bandwidth of said tuning apparatus compared to a predetermined bandwidth setting, servo means driving the bandwidth control means of said adjustable tuning apparatus in accordance with said bandwidth error signal to adjust the bandwidth of said tuning apparatus in accordance with said predetermined bandwidth setting, said receiver means also producing a signal level error signal in accordance with the signal level produced at an output of said adjustable tuning apparatus and compared with a predetermined level, servo means driving the signal level control means in accordance with the signal level error signal.

* * * * *